(12) United States Patent
Mori

(10) Patent No.: US 8,822,811 B2
(45) Date of Patent: Sep. 2, 2014

(54) BACK PROTECTIVE SHEET FOR SOLAR CELL MODULE, PRODUCTION METHOD OF SAME AND SOLAR CELL MODULE

(75) Inventor: Takeshi Mori, Tokyo (JP)

(73) Assignee: Lintec Corporation, Tokyo (JP)

( * ) Notice: Subject to any disclaimer, the term of this patent is extended or adjusted under 35 U.S.C. 154(b) by 123 days.

(21) Appl. No.: 13/257,868

(22) PCT Filed: Mar. 26, 2010

(86) PCT No.: PCT/JP2010/002166
§ 371 (c)(1),
(2), (4) Date: Sep. 20, 2011

(87) PCT Pub. No.: WO2010/109898
PCT Pub. Date: Sep. 30, 2010

(65) Prior Publication Data
US 2012/0031474 A1    Feb. 9, 2012

(30) Foreign Application Priority Data
Mar. 27, 2009    (JP) .................................. 2009-078707

(51) Int. Cl.
| H01L 31/048 | (2014.01) |
| B05D 3/02 | (2006.01) |
| B05D 3/00 | (2006.01) |
| B05D 5/00 | (2006.01) |
| B32B 27/20 | (2006.01) |
| C09D 127/12 | (2006.01) |
| B32B 7/12 | (2006.01) |
| B32B 27/36 | (2006.01) |
| B32B 27/08 | (2006.01) |
| B32B 27/30 | (2006.01) |

(52) U.S. Cl.
CPC ............. *B32B 27/08* (2013.01); *B32B 2457/12* (2013.01); *C09D 127/12* (2013.01); *B32B 2255/10* (2013.01); *B32B 2250/02* (2013.01); *Y02E 10/50* (2013.01); *B32B 7/12* (2013.01); *B32B 2255/26* (2013.01); *B32B 2307/7246* (2013.01); *H01L 31/048* (2013.01); *B32B 27/36* (2013.01); *B32B 2250/24* (2013.01); *B32B 27/306* (2013.01); *B32B 2307/712* (2013.01)
USPC ........... 136/251; 428/421; 428/143; 428/354; 427/385.5

(58) Field of Classification Search
USPC ......... 136/251; 428/421, 354, 143; 427/385.5
See application file for complete search history.

(56) References Cited

U.S. PATENT DOCUMENTS

2007/0154704 A1 * 7/2007 Debergalis et al. ........... 428/323

FOREIGN PATENT DOCUMENTS

| JP | 2007-193271 A | 2/2002 |
| JP | A-2007-035694 | 2/2007 |

(Continued)

OTHER PUBLICATIONS

Machine translation of JP 2007-193271.*

(Continued)

*Primary Examiner* — Ling Choi
*Assistant Examiner* — Catherine S Branch
(74) *Attorney, Agent, or Firm* — Christopher Casieri (57) ABSTRACT

A back protective sheet for a solar cell module in which a fluorine resin layer containing a pigment is formed on at least one side of a base sheet, wherein the density of the pigment in the direction of thickness of the fluorine resin layer is higher on the side opposite from the base sheet than on the side facing the base sheet.

4 Claims, 2 Drawing Sheets

(56) References Cited

FOREIGN PATENT DOCUMENTS

| JP | 2007-193271 A | 8/2007 |
| JP | 2009-010269 A | 1/2009 |
| WO | WO 2007/001706 A1 | 1/2007 |
| WO | WO 2007/010706 A1 | 1/2007 |
| WO | WO 2007/079246 A2 | 7/2007 |
| WO | WO 2008122619 A1 * | 10/2008 |
| WO | WO 2009/157449 A1 | 12/2009 |

OTHER PUBLICATIONS

MSDS for propylene glycol monomethyl ether (undated).*
Darden et al., "Fluoropolymer Coatings for Plastics," NPCA/FSCT Conference (Jun. 23, 2009).*

* cited by examiner

BACK PROTECTIVE SHEET FOR SOLAR CELL MODULE, PRODUCTION METHOD OF SAME AND SOLAR CELL MODULE

This application is a 371 application of PCT/JP2010/002166, filed Mar. 26, 2010, which, in turn, claims priority of Japanese Patent Application No. 2009-078707, filed on Mar. 27, 2009.

TECHNICAL FIELD

The present invention relates to a back protective sheet for a solar cell module, and to a solar cell module provided with the same.

The present application claims priority on the basis of Japanese Patent Application No. 2009-78707 filed in Japan on Mar. 27, 2009, the contents of which are incorporated herein by reference.

BACKGROUND ART

Solar cell modules are devices that convert light energy from the sun into electrical energy, and are attracting attention as systems capable of generating electrical power without discharging carbon dioxide. These solar cell modules are required to not only have high electric power generation efficiency, but also have durability that enables them to withstand long-term use even in cases when used outdoors.

Figure 3:
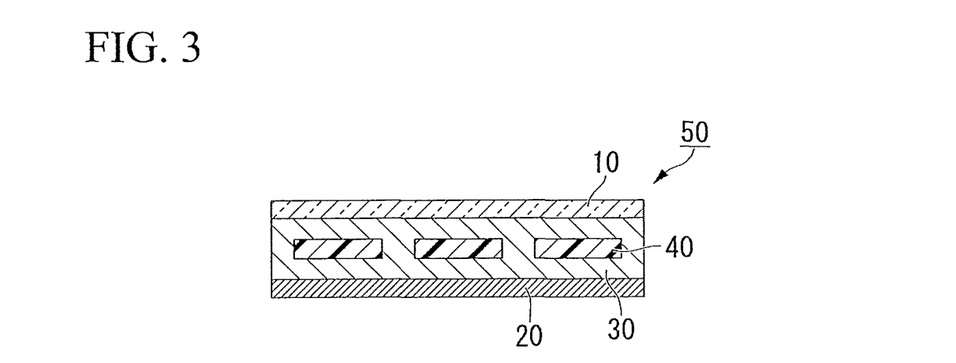
FIG. 3 is a schematic block diagram of a solar cell module of the present invention.

FIG. 3 is a schematic longitudinal cross-sectional view showing an example of a solar cell module.

This solar cell module 50 is mainly composed of solar cells 40 serving as photovoltaic power generation elements, a sealing material 30 serving as an electrical insulator that prevents short-circuiting of electrical circuits, a front protective sheet (front sheet) 10 laminated onto the front of the sealing material 30, and a back protective sheet (back sheet) 20 laminated onto the back of the sealing material 30.

In order to impart weather resistance and durability to the solar cell module 50 enabling it to withstand outdoor and indoor use over a long period of time, it is necessary to protect the solar cells 40 and the sealing material 30 from wind and rain, humidity, dust and mechanical impacts while also maintaining the inside of the solar cell module 50 in a sealed state that is isolated from the outside air. Consequently, the front sheet 10 and the back sheet 20 are required to have superior weather resistance, and are required to have a low level of water vapor permeability in particular.

In addition, it is also necessary for the back sheet to have durability and light reflectivity.

Back sheets have been previously proposed which, together with forming a fluorine resin layer on a base sheet, have an inorganic pigment such as titanium dioxide ($TiO_2$) or silica ($SiO_2$) dispersed in the fluorine resin layer in order to give the back sheet durability, weather resistance, light reflectivity and water vapor impermeability. For example, Patent Document 1 discloses a back sheet of a solar cell module employing a structure in which a cured coated film of a curable functional group-containing fluorine polymer coating material is formed on at least one side of a water-impermeable sheet, and a pigment such as titanium dioxide is uniformly dispersed in the cured coated film of the fluorine polymer coating material.

PRIOR ART DOCUMENTS

Patent Documents

[Patent Document 1] Japanese Unexamined Patent Application, First Publication No. 2007-35694

SUMMARY OF THE INVENTION

Problems to be Solved by the Invention

Various studies have been conducted to further improve the performance of solar cell modules, and there is a desire for further improvement of water vapor impermeability and weather resistance of the back sheet as well.

However, in the case a structure in which a pigment is uniformly dispersed in a fluorine resin layer as in the back sheet disclosed in Patent Document 1, there are limitations on the degree to which water vapor impermeability and weather resistance can be improved. In the case of increasing the amount of pigment in the fluorine resin layer in order to enhance the water vapor impermeability and weather resistance of a back sheet, problems result such as increased susceptibility of separation of the fluorine resin layer due to poor adhesion between the fluorine resin layer and the base sheet, as well as increased susceptibility to cracking of the fluorine resin layer.

With the foregoing in view, an object of the present invention is to provide a technology capable of enhancing water vapor impermeability and weather resistance while ensuring adhesion of the fluorine resin film in a back sheet employing a structure in which a fluorine resin layer containing a pigment is formed on a base sheet.

Means for Solving the Problems

In order to solve the aforementioned problems, the present invention provides a back sheet in which a fluorine resin layer containing a pigment is formed on at least one side of a base sheet, wherein the density of the pigment in the direction of thickness of the fluorine resin layer is higher on the side opposite from the base sheet than on the side facing the base sheet.

In the back sheet of the present invention, the arithmetic average roughness (Ra) of the fluorine resin layer as measured in compliance with JIS B0601-1994 is preferably 1.0 µm or more.

In the back sheet of the present invention, the pigment is preferably one type or two or more types selected from the group consisting of titanium dioxide, surface-treated titanium dioxide, silica and surface-treated silica.

In the back sheet of the present invention, a structure is preferably employed in which the fluorine resin layer is formed on one side of the base sheet, and an adhesive layer is formed on the other side of the base sheet.

In addition, the present invention provides a production method of a back sheet that includes a step for coating a coating liquid containing a fluorine resin and a pigment onto at least one side of a base sheet, and a drying step for forming a fluorine resin layer by positioning the base sheet so that the undried coated film surface of the base sheet is facing downward and then drying the coated film.

In the back sheet production method of the present invention, the drying temperature of the undried coated film is preferably a temperature that is below the boiling point of a solvent contained in the coating liquid.

In addition, the present invention provides a solar cell module provided with the back sheet on the back side thereof.

Effects of the Invention

Since the back sheet of the present invention in which a fluorine resin layer containing a pigment is formed on at least one side of a base sheet is composed so that the density of the pigment in the direction of thickness of the fluorine resin layer is higher on the side opposite from the base sheet than the side facing the base sheet, water vapor impermeability and weather resistance can be improved in comparison with a back sheet in which an equal amount of pigment is uniformly dispersed throughout the fluorine resin layer.

In addition, since the pigment density in the direction of thickness of the fluorine resin layer is lower on the side that faces the base sheet, adequate adhesion is obtained between the fluorine resin layer and the base sheet, thereby making it possible to prevent separation of the fluorine resin layer, and resulting in superior durability.

Moreover, since the pigment density in the direction of thickness of the fluorine resin layer is higher on the side opposite from the base sheet, surface roughness of the fluorine resin layer increases, thereby making it possible to preventing the occurrence of blocking in which the fluorine resin layer ends up adhering to the sheet with which it contacts when unwinding the back sheet after having stored by winding into a roll.

The back sheet production method of the present invention facilitates the production of a back sheet having superior water vapor impermeability, weather resistance and durability as previously described by preparing a coating liquid containing a fluorine resin and a pigment, coating this coating liquid onto a base sheet, positioning the base sheet so that the undried coated film surface is facing downward, and forming a fluorine layer by drying the coated film.

The solar cell module of the present invention has superior water vapor impermeability and weather resistance, and retains durability enabling it to withstand long-term outdoor use since the aforementioned back sheet according to the present invention is provided on the back side of the module.

EMBODIMENTS OF THE INVENTION

FIG. 3 is a schematic block diagram of a solar cell module having the back sheet of the present invention.

As shown in FIG. 3, this solar cell module 50 employs a configuration having solar cells 40, a sealing material 30 that covers the solar cells 40, a front sheet 10 fixed to the front (light receiving surface) of the sealing material 30, and a back sheet 20 adhered to the back of the sealing material 30. In order to impart weather resistance and durability capable of withstanding long-term indoor and outdoor use to the solar cell module, it is necessary to protect the solar cells 40 and the sealing material 30 from wind and rain, humidity, dust and mechanical impacts, and maintain the inside of the solar cell module in a sealed state that is isolated from the outside air. Consequently, the back sheet 20 is required to have high degrees of water vapor impermeability and weather resistance. Moreover, it is also necessary to give the back sheet 20 as high a degree of reflectance as possible in order to maximally reduce light reception loss caused by escape of light, which has entered from the light receiving surface of the solar cell module 50, to the back through the plurality of gaps between the solar cells 40.

Figure 1A:
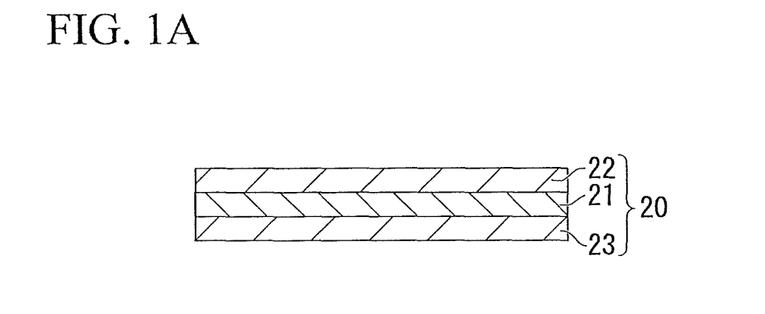
FIG. 1A is a cross-sectional view of an example of a back protective sheet for a solar cell module of the present invention.
Figure 1B:
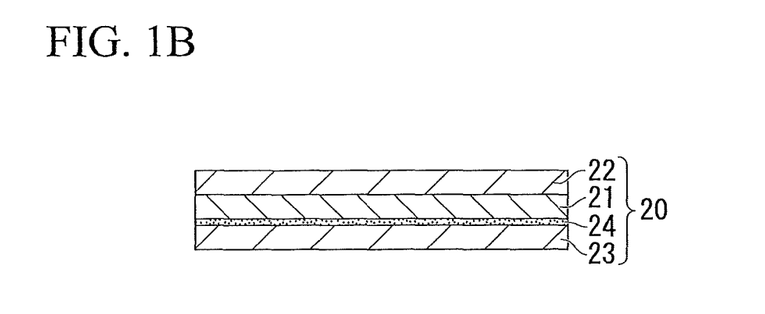
FIG. 1B is a cross-sectional view of another example of a back protective sheet for a solar cell module of the present invention.

FIGS. 1A and 1B are cross-sectional views showing examples of the configuration of the back sheet of the present invention.

The back sheet 20 in FIG. 1A employs a configuration in which a fluorine resin layer 22 is laminated onto one side of a base sheet 21, and an adhesive layer 23 is laminated directly onto the other side of the base sheet 21. The back sheet 20 of FIG. 1B employs a configuration in which the fluorine resin layer 22 is laminated onto one side of the base sheet 21, and the adhesive layer 23 is laminated onto the other side of the base sheet 21 through a laminating adhesive layer 24.

Figure 2:
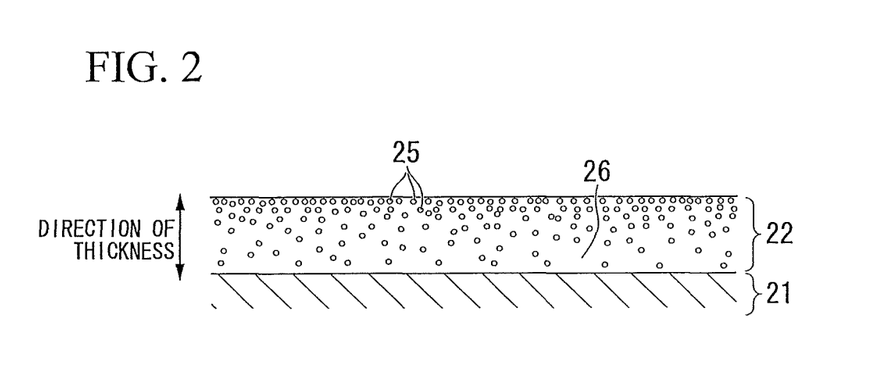
FIG. 2 is an enlarged view of the essential portion of FIG. 1A and FIG. 1B.

The fluorine resin layer 22 has a pigment 25, such as titanium dioxide, contained in a fluorine resin 26 serving as a base thereof. FIG. 2 is an enlarged view of the essential portion of FIGS. 1A and 1B, and indicates the uneven distribution of the pigment 25 in the direction of thickness in the fluorine resin layer 22 of the back sheet 20. In the back sheet 20 of the present embodiment, the density of the pigment 25 in the direction of thickness of the fluorine resin layer 22 is higher on the side opposite from the base sheet (outside) than on the side facing the base sheet. Furthermore, FIG. 2 merely indicates an example of the uneven distribution of the pigment, and the present invention is not limited to the contents of FIG. 2. The density of the pigment 25 may be that of a gradient pattern in which the density of the pigment 25 gradually increases in the direction of thickness of the fluorine resin layer 22 from the side facing the base sheet to the side on the opposite side from the base sheet, or may be that of a pattern in which the density of the pigment 25 increases in a stepwise manner from the side facing the base sheet to the side on the opposite side from the base sheet. In addition, the pigment density is preferably lower on the side of the fluorine resin layer 22 facing the base sheet, and this side facing the base sheet may be composed of the fluorine resin 26 that does not contain the pigment 25.

A resin sheet that is typically used as a resin sheet in a solar cell module protective sheet can be used for the resin sheet used for the base sheet 21. Examples of this sheet include sheets composed of resins such as polyethylene, polypropylene, polystyrene, poly(methyl methacrylate), polytetrafluoroethylene, polyamide (Nylon 6, Nylon 66), polyacrylonitrile, polyvinyl chloride, polyethylene terephthalate (PET), polybutylene terephthalate (PBT), polyethylene naphthalate (PEN), polyoxymethylene, polycarbonate, polyphenylene oxide, polyester urethane, poly-m-phenylene isophthalamide, poly-p-phenylene terephthalamide, acrylic resin, acrylonitrile-butadiene-styrene resin (ABS resin), epoxy resin, polystyrene-polycarbonate alloy resin and phenol resin. In particular, a sheet composed of polyesters such as PET, PBT or PEN is preferable, while more specifically, a PET sheet is more preferable.

In addition, the base sheet 21 composed of polyester such as the aforementioned PET, PBT or PEN, to which has been imparted resistance to hydrolysis using a known method, is more preferable. In the case of using these preferable resin sheets for the base sheet 21, the water vapor impermeability, electrical insulating properties, heat resistance and chemical resistance of the back sheet 20 can be further improved.

Furthermore, the base sheet 21 may also contain various types of additives such as an organic filler, inorganic filler or ultraviolet absorber. In addition, a vapor deposition layer for enhancing weather resistance or moisture resistance and the like may be further provided on the surface of the base sheet 21. The vapor deposition layer is formed by a chemical vapor deposition such as plasma enhanced chemical vapor deposition, thermal chemical vapor deposition or photo chemical vapor deposition, or a physical vapor deposition such as vacuum deposition, sputtering or ion plating. The vapor deposition layer is composed of an inorganic oxide, and that composed of a metal oxide such as silicon dioxide ($SiO_2$) or aluminum oxide ($Al_2O_3$) is preferable. The vapor deposited layer may be composed of one type of metal oxide or may be composed of a plurality of types of metal oxides.

The thickness of the base sheet 21 is selected based on the electrical insulating properties required by the solar cell system. For example, in the case the base sheet 21 is a resin sheet, the film thickness thereof is preferably within the range of 10 µm to 300 µm. More specifically, in the case the base sheet 21 is a PET sheet, the thickness of the PET sheet is preferably within the range of 10 µM to 300 µm, more preferably within the range of 30 µm to 200 µm, and even more preferably within the range of 50 µm to 150 µm, from the viewpoints of light weight and electrical insulating properties.

The fluorine resin layer 22 is formed by preparing a coating liquid containing a fluorine-containing resin serving as a base resin, a pigment and a solvent, coating the coating liquid onto one side of the base sheet 21, and drying.

Although there are no particular limitations on the fluorine-containing resin incorporated in the coating liquid provided it is a resin that contains fluorine and does not impair the effects of the present invention, that which dissolves in the solvent (organic solvent or water) of the coating liquid and is capable of crosslinking is preferable. Preferable examples of the fluorine-containing resin include polymers composed mainly of chlorotrifluoroethylene (CTFE), such as LUMIFLON (trade name) manufactured by Asahi Glass Co., Ltd., CEFRALCOAT (trade name) manufactured by Central Glass Co., Ltd. or FLUONATE (trade name) manufactured by DIC Corp., and polymers composed mainly of tetrafluoroethylene (TFE) such as ZEFFLE (trade name) manufactured by Daikin Industries, Ltd.

The aforementioned LUMIFLON (trade name) is an amorphous polymer containing as main constituent units thereof CTFE and several types of specific alkyl vinyl ethers and hydroxyalkyl vinyl ethers. Polymers having monomer units of hydroxyalkyl ether in the manner of LUMIFLON (trade name) are preferable since they demonstrate superior solvent solubility, crosslinking reactivity, base adhesion, pigment dispersibility, hardness and flexibility.

The aforementioned Zeffle (trade name) is a copolymer of TFE and an organic solvent-soluble hydrocarbon olefin, and in the case of having a hydrocarbon olefin provided with a highly reactive hydroxyl group in particular, the use thereof is preferable since it demonstrates superior solvent solubility, crosslinking reactivity, base adhesion and pigment dispersibility.

A polymer of a fluoroolefin having a curable functional group can also be used for the fluorine-containing resin, and examples of curable functional groups include hydroxyl groups, carboxyl groups, amino groups and glycidyl groups.

In addition, a monomer that is copolymerizable with the fluorine-containing resin may be incorporated in the coating liquid, and examples of such monomers include vinyl esters of carboxylic acids such as vinyl acetate, vinyl propionate, vinyl isobutyrate, vinyl pivalate, vinyl caproate, vinyl versatate, vinyl laurate, vinyl stearate, vinyl cyclohexylcarboxylate or vinyl benzoate, and alkyl vinyl ethers such as methyl vinyl ether, ethyl vinyl ether, butyl vinyl ether and cyclohexyl vinyl ether.

Moreover, the fluorine-containing resin incorporated in the coating liquid may be a polymer composed of one or more types of monomers or may be a terpolymer. Examples of terpolymers include DYNEON THV (trade name, 3M Corp.), which is a terpolymer of VdF, TFE and hexafluoropropylene. Such compound polymers are preferable since they make it possible to impart the characteristics of each of the monomers to the polymer. For example, the aforementioned DYNEON THV (trade name) is preferable since it can be produced at a comparatively low temperature, is able to adhere to elastomer and hydrocarbon-based plastics, and has superior flexibility and optical transparency.

There are no particular limitations on the solvent contained in the coating liquid provided it does not impair the effects of the present invention, and examples of solvents that can be used preferably include one or more types thereof selected from the group consisting of methyl ethyl ketone (MEK), cyclohexanone, acetone, methyl isobutyl ketone (MIBK), toluene, xylene, methanol, isopropanol, ethanol, heptane, ethyl acetate, isopropyl acetate, n-butyl acetate and n-butyl alcohol. From the viewpoints of solubility in the base resin component in the coating liquid, low rate of remaining in the coated film (low boiling point temperature) and silica dispersibility, the solvent more preferably contains one or more types of solvents selected from the group consisting of xylene, cyclohexanone and MEK.

The fluorine resin layer 22 is preferably cured with a crosslinking agent in order to improve weather resistance and scratch resistance. There are no particular limitations on the crosslinking agent provided it does not impair the effects of the present invention, and examples of crosslinking agents that are used preferably include metal chelates, silanes, isocyanates and melamines. In the case of assuming that the back sheet is to be used outdoors for 30 years or more, the aliphatic isocyanate is preferable for the crosslinking agent from the viewpoint of weather resistance.

There are no particular limitations on the pigment 25 provided it does not impair the effects of the present invention, and a pigment that has favorable dispersibility in the fluorine resin layer 22, allows the obtaining of high reflectance, and allows the formation of the fluorine resin layer 22 having superior durability is preferable, examples of which include titanium dioxide, surface-treated titanium dioxide, carbon black, mica, polyamide powder, boron nitride, zinc oxide, aluminum oxide, silica and surface-treated silica, with titanium dioxide, surface-treated titanium dioxide, silica and surface-treated silica being more preferable.

More specifically, preferable examples of fillers for imparting durability and ultraviolet blocking include TiPure R105 (trade name, DuPont Corp.), which is a rutile form titanium dioxide that has been coated and surface treated, and CAB-O-SIL TS 720(trade name, Cabot Corp.), which a hydrophobic silica in which hydroxyl groups on the silica surface have been modified by surface treatment with dimethyl silicone.

The content of the pigment 25 in the fluorine resin layer 22 is preferably within the range of 10 parts by weight to 100 parts by weight, and more preferably within the range of 20 parts by weight to 90 parts by weight, based on 100 parts by weight of the fluorine resin in terms of the solid fraction thereof.

If the content of the pigment 25 is below the aforementioned ranges, even if the pigment 25 is concentrated at a high density on the side opposite from the base sheet, the effects of improving water vapor impermeability and weather resistance of the fluorine resin layer 22 are unable to be adequately obtained. On the other hand, if the content of the pigment 25 exceeds the aforementioned ranges, the pigment ends up being in excess, so that even if the density of the pigment 25 is lower on the side facing the base sheet, adhesion between the fluorine resin layer 22 and the base sheet 21 may become poor, the viscosity of the coating liquid may increase considerably resulting in poor coating suitability, or streaks and air bubble remnants may form after drying.

In addition to the aforementioned fluorine-containing polymer, the pigment 25 and the solvent, an additive such as a curing agent (crosslinking agent), crosslinking promoter, catalyst, ultraviolet absorber, plasticizer or antioxidant can also be contained in the coating liquid.

Examples of crosslinking promoters that can be used include dibutyltin dilaurate and dioctyltin dilaurate, and these crosslinking promoters are used to promote crosslinking between the fluorine-containing resin and isocyanate.

The surface of the fluorine resin layer 22 has a certain degree of roughness since the pigment 25 is present at high density on the side opposite from the base sheet, and the arithmetic average surface roughness (Ra) as measured in compliance with JIS B601-1994 is preferably 1.0 μm or more. If the surface roughness (Ra) is 1.0 μm or more, it becomes possible to prevent the occurrence of blocking, in which the fluorine resin layer 22 ends up adhering to the sheet with which it contacts when unwinding the back sheet 20 after having stored by winding the back sheet 20 into a roll. If the surface roughness (Ra) is less than 1.0 μm, the aforementioned blocking occurs resulting in poor sheet handling ease.

The adhesive layer 23 is preferably a thermoplastic resin from the viewpoint of improving adhesion with the sealing material 30 when laminating onto the back of the solar cell module 50 in the case of using as a back sheet, and examples thereof include polyethylene resin, polypropylene resin, vinylidene chloride resin, vinyl chloride resin, fluorine resin, acetal-based resin, acrylonitrile-styrene copolymer resin (AS resin), acrylonitrile-butadiene-styrene copolymer resin (ABS resin), methyl methacrylate-butadiene-styrene copolymer resin (MBS resin), acrylurethane resin, ethylene-vinyl acetate copolymer (EVA), ethylene-methacrylic acid copolymer (EMMA), and ionomer resins in which ethylene-methacrylic acid copolymer is crosslinked with metal ions there between.

Moreover, the adhesive layer preferably has thermal adhesiveness so as to be able to adhere to the sealing material 30 when heated. Here, thermal adhesiveness refers to a property enabling the demonstration of adhesiveness as a result of heating treatment.

The temperature of the heating treatment is normally within the range of 50° C. to 200° C. From the viewpoint of having thermal adhesiveness, the adhesive layer 23 is preferably a resin composed of one type selected from the group consisting of ethylene-vinyl acetate copolymer (EVA), ethylene-methacrylic acid copolymer (EMAA), ionomer resin and a mixture thereof. In general, the sealing material 30 is frequently a sealing resin composed of EVA, and in this case, adhesion between the sealing material 30 and the adhesive layer 23 can be improved by making the resin layer 23 a resin composed of a polymer mainly composed of EVA.

There are no particular limitations on the thickness of the adhesive layer 23 provided it does not impair the effects of the present invention. More specifically, in the case the base resin of the adhesive layer 23 is EVA, the thickness thereof is preferably within the range of 10 μm to 200 μm, and more preferably within the range of 20 μm to 150 μm, from the viewpoints of light weight, electrical insulating properties and the like.

Other polymers and various types of compounding agents may be added to the adhesive layer 23 as necessary. Soft polymers and other organic polymer fillers are used for the other polymers.

In addition, the various types of compounding agents may be organic compounds or inorganic compounds, and compounding agents are used that are commonly used in the resin industry. Examples of compounding agents used include anti-aging agents, stabilizers, pigments such as titanium dioxide, flame retardants, plasticizers, nucleating agents, hydrochloric acid absorbers, antistatic agents, inorganic fillers, lubricants, blocking preventive agents and ultraviolet absorbers.

In the back sheet of the present invention, the fluorine resin layer 22 may be laminated onto one side of the base sheet 21, and the adhesive layer 23 may be laminated onto the other side of the base sheet 21 through the laminating adhesive layer 24 (FIG. 1B). Examples of adhesives used in the laminating adhesive layer 24 include acrylic-based adhesives, urethane-based adhesives, epoxy-based adhesives and ester-based adhesives. One type of these adhesives may be used alone or two or more types may be used in combination.

Since the back sheet 20 of the present embodiment is configured so that the density of the pigment 25 in the direction of thickness of the fluorine resin layer 22 formed on the base sheet 21 is higher on the side opposite from the base sheet than the side facing the base sheet, in comparison with the case of uniformly dispersing an equal amount of the pigment 25 throughout the fluorine resin layer 22, water vapor impermeability and weather resistance of the back sheet 20 can be improved.

In addition, since the pigment density in the direction of thickness of the fluorine resin layer 22 on the side facing the base sheet is low, adhesion between the fluorine resin layer 22 and the base sheet 21 is adequately obtained, thereby making it possible to prevent separation of the fluorine resin layer 22 and resulting in superior durability.

Moreover, as a result of making the pigment density in the direction of thickness of the fluorine resin layer 22 higher on the side opposite from the base sheet, surface roughness of the fluorine resin layer 22 increases, thereby making it possible to prevent the occurrence of blocking in which the fluorine resin layer 22 ends up adhering to the sheet with which it contacts when unwinding the back sheet 20 after having stored the back sheet 20 by winding into a roll.

The back sheet of the present invention can be produced according to the production method according to the present invention that includes preparing a coating liquid containing the fluorine-containing resin, the pigment 25 and the solvent, coating the coating liquid onto the upper surface of the base sheet 21, positioning the base sheet 21 so that the undried coated film surface is facing downward, and drying the coated film to form the fluorine resin layer 22.

There are no particular limitations on the composition of the coating liquid provided it is able to adequately demonstrate the effects of the present invention. As an example thereof, an example of the composition of a coating liquid in the case of using a chlorotrifluoroethylene (CTFE)-based copolymer for the fluorine-containing resin consists of incorporating 5 parts by weight to 100 parts by weight of pigment, 5 parts by weight to 20 parts by weight of curing agent, 0.0001 parts by weight to 0.01 parts by weight of crosslinking promoter, and 50 parts by weight to 250 parts by weight of a solvent such as methyl ethyl ketone based on 100 parts by weight of the CTFE-based copolymer in terms of the solid fraction thereof. The coating liquid is prepared by mixing each of the aforementioned materials and then adequately dispersing the pigment using a disperser and the like.

A conventionally known method can be used to coat the coating liquid onto the upper surface of the base sheet 21, examples of which include bar coating, reverse roll coating, knife coating, roll knife coating, gravure coating, air doctor coating and doctor blade coating, and coating is carried out so as to reach a desired film thickness.

There are no particular limitations on the film thickness of the fluorine resin layer 22 formed by curing the coating liquid, and is, for example, 5 μm or more. From the viewpoints of water vapor impermeability, weather resistance and light weight property, the film thickness of the fluorine resin layer 22 is preferably 5 μm to 100 μm, more preferably 8 μm to 50 μm, and even more preferably 10 μM to 20 μm.

In the production method of the present invention, after coating the coating liquid onto the upper surface of the base sheet 21, it is necessary to slowly dry the coated film by maintaining the base sheet 21 such that the undried coated film surface is facing downward before the coated film has dried. There are no particular limitations on the method used to maintain the undried coated film surface of the base sheet 21 facing downward, and in the case of a short sheet, the edges of the base sheet 21 that are not coated can be held with a clamping tool such as a clamp, or the sides of the base sheet 21 that are not coated can be held by suctioning, while in the case of a long sheet, the coated surface may be inverted after having coated the coating liquid onto the upper surface of the base sheet 21.

As a result of maintaining the undried coated film surface facing downward, the pigment 25 in the coated film gradually settles, and as a result thereof, a gradient pattern is formed in which the density of the pigment 25 in the direction of thickness of the fluorine resin layer 22 gradually becomes higher moving towards the side opposite from the base sheet from the side facing the base sheet as shown in FIG. 2.

There are no particular limitations on the drying method in the present invention provided the density of the pigment contained in the dried coated film is able to form the desired gradient pattern, and various drying methods can be used. Although examples of drying methods include infrared heating, electrothermal heating, heating with a hot plate and hot air convection heating, from the viewpoint of controlling the gradient pattern of the pigment density, hot air convection heating is preferable.

The temperature during the drying process of the coated coating liquid is a temperature that allows the coated film to dry slowly, is preferably a temperature that is lower than the boiling point of the solvent incorporated in the coating liquid, and is more preferably a temperature that is 10° C. to 30° C. lower than the boiling point of the solvent.

As a result, the fluorine resin layer 22 is formed in which the density of the pigment 25 in the direction of thickness of the fluorine resin layer 22 becomes higher on the side opposite from the base sheet (outside) than on the side facing the base sheet.

Subsequently, by coating an adhesive for lamination on the other side of the base sheet 21, superimposing and laminating an EVA sheet thereon, and then laminating the adhesive layer 23, the back sheet 20 shown in FIG. 1B is produced. In addition, the back sheet 20 can also be produced by forming the adhesive layer 23 directly on the other side of the base sheet 21 (FIG. 1A).

According to the back sheet production method of the present invention, the back sheet 20 can be easily produced that is provided with the fluorine resin layer 22, in which the density of the pigment 25 is higher on the side opposite from the base sheet than on the side facing the base sheet, and has superior water vapor impermeability, weather resistance and durability.

The solar cell module of the present invention has the aforementioned back sheet 20 adhered to the sealing material 30 on the back (back side) of the solar cell module 50.

There are no particular limitations on the type or structure of the solar cell module 50, and can be an amorphous silicon solar cell, crystalline silicon solar cell, microcrystalline silicon solar cell, gallium arsenide or other compound semiconductor solar cell, or dye-sensitized solar cell.

As a result of having the back sheet 20 adhered to the back (back side) of the sealing material that composes the module, the solar cell module of the present invention has superior water vapor impermeability and weather resistance, and retains durability enabling it to withstand long-term, outdoor use.

EXAMPLES

Example 1

[Coating Liquid for Forming Fluorine Resin Layer] 120 parts by weight of methyl ethyl ketone, 18.2 parts by weight of silica (Cabot Specialty Chemicals, Inc., trade name: CAB-O-SIL TS-720) and 100 parts by weight of titanium oxide (Du Pont Corp., trade name: Ti-PURE R-105) were mixed followed by dispersing for 30 minutes with a T.K. Homodisperser (Primix Corp.) to prepare a pigment dispersion.

100 parts by weight of CTFE-based copolymer (Asahi Glass Co., Ltd., trade name: LUMIFLON LF200, solid fraction concentration: 60% by weight) as fluorine resin, 10.7 parts by weight of an aliphatic isocyanate crosslinking agent (Sumika Bayer Urethane Co., Ltd., SUMIDULE N3300, solid fraction concentration: 100% by weight), 0.0001 parts by weight of dioctyltin dilaurate as crosslinking promoter, and 110 parts by weight of methyl ethyl ketone were incorporated into 87 parts by weight of the prepared pigment dispersion to prepare a coating liquid for forming a fluorine resin layer.

Coating Liquid for Forming Adhesive Layer 90 parts by weight of a main agent in the form of a urethane-based adhesive (Mitsui Chemicals, Inc., trade name: TAKELAC A-515) and 10 parts by weight of a curing agent (Mitsui Chemicals, Inc., trade name: TAKENATE A-3) were mixed to obtain a coating liquid for the laminating adhesive layer.

The coating liquid for forming the fluorine resin layer was coated onto one side of a PET film (Teijin Dupont Films Japan, Ltd., Melinex S, thickness: 125 μn) with a bar coater so that the coated film thickness after drying was 15 μM, and the PET film was positioned so that the undried coated film surface was facing downward, and then dried for 90 seconds while blowing hot air at a temperature of 60° C. onto the coated film side of the PET film at a flow rate of 2 m/s to obtain a PET film on which was formed a fluorine resin layer.

The coating film for forming the adhesive layer was coated onto the back side (side on which the fluorine resin layer was not formed) of the resulting PET film on which was formed a fluorine resin layer using a bar coater to a thickness after drying of 5 μm, and an EVA film having a thickness of 100 μm was laminated thereon after drying for 1 minute at 80° C. Subsequently, the laminated PET film was allowed to stand for 7 days in an environment at 23° C. and RH of 50% to produce the back sheet of Example 1.

Example 2

The back sheet of Example 2 was produced in the same manner as Example 1 with the exception of changing the amount of the titanium dioxide in Example 1 to 50 parts by weight.

Example 3

The back sheet of Example 3 was produced in the same manner as Example 1 with the exception of using an equal amount of a TFE-based polymer (Daikin Industries, Ltd., trade name: ZEFFLE, solid fraction concentration: 65% by weight) instead of the CTFE-based copolymer used in Example 1.

Comparative Example 1

The back sheet of Comparative Example 1 was produced in the same manner as Example 1 with the exception of positioning the PET film of Example 1 so that the undried coated film surface was facing upward, and drying for 60 seconds by blowing hot air onto the surface of the coated film at a temperature of 120° C. and flow rate of 2 m/s.

Comparative Example 2

The back sheet of Comparative Example 2 was produced in the same manner as Example 1 with the exception of positioning the PET film used in Example 2 so that the undried coated film surface was facing upward, and drying for 60 seconds by blowing hot air onto the surface of the dried film at a temperature of 120° C. and flow rate of 2 m/s.

Comparative Example 3

The back sheet of Comparative Example 3 was produced in the same manner as Example 1 with the exception of positioning the PET film used in Example 1 so that the undried coated film surface was facing upward, and drying for 120 seconds by blowing hot air onto the surface of the coated film at a temperature of 25° C. and a flow rate of 2 m/s.

Comparative Example 4

The back sheet of Comparative Example 4 was produced in the same manner as Example 1 with the exception of positioning the PET film used in Example 2 so that the undried coated film surface was facing upward, and drying for 120 seconds by blowing hot air on the coated film surface at a temperature of 25° C. and a flow rate of 2 m/s.

The conditions for producing the fluorine resin layer of the back sheets of Examples 1 to 3 and Comparative Examples 1 to 4 are summarized in Table 1 below.

TABLE 1

| | Drying Conditions | Drying Time (sec) | Positioning of Coated Film Side |
|---|---|---|---|
| Example 1 | 60° C., 2 m/s | 90 | Downward |
| Example 2 | 60° C., 2 m/s | 90 | Downward |
| Example 3 | 60° C., 2 m/s | 90 | Downward |
| Comp. Ex. 1 | 120° C., 2 m/s | 60 | Upward |
| Comp. Ex. 2 | 120° C., 2 m/s | 60 | Upward |

TABLE 1-continued

| | Drying Conditions | Drying Time (sec) | Positioning of Coated Film Side |
|---|---|---|---|
| Comp. Ex. 3 | 25° C., 2 m/s | 120 | Upward |
| Comp. Ex. 4 | 25° C., 2 m/s | 120 | Upward |

The back sheets respectively produced in Examples 1 to 3 and Comparative Examples 1 to 4 were measured and evaluated under the following conditions for gloss, surface roughness, adhesive strength, water vapor impermeability, weather resistance and blocking. The results are summarized in Table 2.

<Gloss>

The specular gloss (60°) of the fluorine resin layer surface of the produced back sheets was measured using a Gloss Meter VG2000 manufactured by Nippon Denshoku Industries Co., Ltd. in accordance with JIS Z8741-1997.

<Surface Roughness>

Arithmetic Average Roughness (Ra)

The arithmetic average roughness of the fluorine resin layer surface of the produced back sheets was measured using the SURFTEST SV-3000S4 manufactured by Mitutoyo Corp. using a cutoff value λc of 0.8 mm and an evaluation length ln of 10 mm in accordance with JIS B0601-1994.

<Adhesive Strength>

1 mm square cross-cuts were made to form of 10×10 squares in the fluorine resin layer of each of the produced back sheets of Examples 1 to 3 and Comparative Examples 1 to 4 in compliance with JIS K5600-5-6: 1999, cellophane tape (Nichiban Co., Ltd., CT24) was affixed thereto, and the number of squares among the total of 100 squares that separated when the tape was peeled off was determined and used to evaluate adhesive strength according to the following evaluation criteria.

A: Extremely good—Separation of 0 to 4 squares
B: Good—Separation of 5 to 9 squares
C: Somewhat poor—Separation of 10 to 19 squares
D: Poor—Separation of 20 or more squares <Evaluation of Water Vapor Impermeability>

The produced back sheets were cut to 90 mm×90 mm, and the water impermeability of the test pieces was evaluated by measuring water vapor permeability under conditions of 40° C. and 90% RH using a water vapor permeability measuring instrument (Mocon Ltd., PERMATRAN-W 3/33) in accordance with ASTM F1249.

<Weather Resistance Test>

The produced back sheets were cut to 70 mm×150 mm, and placed in a sunshine carbon weather meter (Suga Test Instruments Co., Ltd.: WEL-SUN-HC•B) followed by carrying out testing by direct irradiation. Furthermore, test conditions consisted of a black panel temperature of 63±3° C. and water spraying times of 18 minutes per 120 minutes. The presence of cracks was confirmed to evaluate the back sheets. The presence of cracks was evaluated as B while the absence of cracks was evaluated as A.

<Blocking>

The produced back sheets were cut out to A4 size (297 mm long×210 mm wide). After layering 10 of the cut out sheets so that side with the fluorine resin layer contacted the side not having the fluorine resin layer, the top and bottom sheets were placed between A4 size vinyl chloride sheets having a thickness of 3 mm, and placing a 1 kg weight thereon and storing for 7 days in a constant temperature, constant humidity bath at 40° C. and 80% RH, the layered back sheets were allowed to stand undisturbed for 1 hour in a constant temperature chamber at 23° C. and 50% RH. Next, the sheets were separated manually starting with the top sheet, and the sheets were evaluated as to whether or not they were resistant to separation at their lamination interfaces according to the evaluation criteria indicated below.

A: Not resistant to separation (no blocking)
B: Resistant to separation (blocking)

TABLE 2

|  | Gloss | Surface roughness (μm) | Adhesive strength | Water vapor impermeability (g/m²/24 h) | Weather resistance | Blocking |
|---|---|---|---|---|---|---|
| Ex. 1 | 10.5 | 1.17 | A | 82.0 | A | A |
| Ex. 2 | 10.7 | 1.05 | A | 99.0 | A | A |
| Ex. 3 | 10.6 | 1.10 | A | 85.0 | A | A |
| Comp. Ex. 1 | 17.8 | 0.79 | D | 115.5 | A | B |
| Comp. Ex. 2 | 18.0 | 0.61 | C | 125.5 | A | B |
| Comp. Ex. 3 | 18.5 | 0.12 | D | 147.0 | A | B |
| Comp. Ex. 4 | 18.8 | 0.10 | D | 155.0 | B | B |

According to the results of Table 2, in the back sheets of Examples 1 to 3, which were positioned so that the undried coated film surface was facing downward during formation of the fluorine resin layer and were dried at a temperature lower than the boiling point of the solvent (methyl ethyl ketone, boiling point=79.5° C.), the density of the pigment (titanium dioxide, silica) in the direction of thickness of the fluorine resin layer was higher on the side opposite from the base sheet (outside) than on the side facing the base sheet.

As a result of the pigment being unevenly distributed on the side opposite from the base sheet (outside), the gloss of the fluorine resin layer of the back sheets of Examples 1 to 3 was low at about 10 to 11, and the surface roughness (Ra) was 1.0 μm or more.

Since the pigment density on the side facing the base sheet was lower, the back sheets of Examples 1 to 3 demonstrated superior adhesion between the fluorine resin layer and the base sheet in comparison with the back sheets of Comparative Examples 1 and 2 that employed a structure in which the pigment was uniformly distributed throughout the fluorine resin layer.

In addition, the back sheets of Examples 1 to 3 demonstrated lower water vapor permeability than the back sheets of Comparative Examples 1 and 2 that employed a structure in which the pigment was uniformly distributed throughout the fluorine resin layer, and demonstrated water vapor impermeability that was superior to that of the conventional products.

In addition, since the surface roughness of the fluorine resin layer was 1.0 μm or more, the back sheets of Examples 1 to 3 had favorable blocking properties.

On the basis of the above results, the back sheet of the present invention is able to enhance water vapor impermeability and weather resistance while ensuring adhesion of the fluorine resin layer to the base sheet. Thus, the back sheet of the present invention is useful as a back sheet for a solar cell module.

On the other hand, in the back sheets of Comparative Examples 1 and 2, since the back sheets were positioned so that the undried coated film surface was facing upward during formation of the fluorine resin layer and dried at a temperature equal to or higher than the boiling point of the solvent, drying was completed before the occurrence of migration of the pigment in the coated film, thereby resulting in a state in which the pigment was uniformly distributed throughout the fluorine resin layer.

As a result, in the back sheets of Comparative Examples 1 and 2, gloss of the fluorine resin layer increased and surface roughness (Ra) was low at 0.61 μm to 0.79 μm.

In addition, the back sheets of Comparative Examples 1 and 2 demonstrated poor adhesion between the fluorine resin layer and the base sheet in comparison with Examples 1 to 3.

In addition, water vapor permeability of the back sheets of Comparative Examples 1 and 2 was higher than that of Examples 1 to 3, thereby resulting in inferior water vapor impermeability. In addition, although weather resistance was favorable, blocking properties were poor.

In addition, since the back sheets of Comparative Examples 3 and 4 were positioned so that the undried coated film surface was facing upward during formation of the fluorine resin layer and were dried at a temperature below the boiling point of the solvent, in contrast to the case of Examples 1 to 3, the resulting structure was such that the pigment was unevenly distributed at a high density on the side facing the base sheet, while the density of the pigment was low on the side opposite from the base sheet.

Since the density of the pigment on the side opposite from the base sheet was low in the back sheets of Comparative Examples 3 and 4, gloss of the fluorine resin layer thereof was high and surface roughness (Ra) was low at 0.10 μm to 0.12 μm in comparison with Comparative Examples 1 and 2 in which the pigment was uniformly distributed.

In addition, since the pigment was unevenly distributed at a high density on the side facing the base sheet, adhesion between the fluorine resin layer and the base sheet was poor.

In addition, since the water vapor permeability of the back sheets of Comparative Examples 3 and 4 was high in comparison with Examples 1 to 3, water vapor impermeability was inferior and both weather resistance and blocking properties were poor.

INDUSTRIAL APPLICABILITY

The back sheet of the present invention, employing a configuration in which a fluorine resin layer containing a pigment is formed on a base sheet, is able to enhance water vapor impermeability and weather resistance while securing adhesion of the fluorine resin layer, and is useful as a back sheet for a solar cell module.

BRIEF DESCRIPTION OF REFERENCE SYMBOLS

10 Front protective sheet
20 Back protective sheet (back sheet)
21 Base sheet
22 Fluorine resin layer
23 Adhesive layer
24 Laminating adhesive layer
25 Pigment
26 Fluorine resin
30 Sealing material
40 Solar cell
50 Solar cell module

The invention claimed is:
1. A solar cell module comprising solar cells, a sealing material that covers the solar cell, and a back protective sheet wherein the back protective sheet is directly laminated on the sealing material and is provided at the other side face of a light receiving surface of the solar cell module, the back protective sheet comprises a base sheet composed of a resin sheet, a fluorine resin layer containing a fluorine-containing resin and a pigment and an adhesive layer, the adhesive layer is directly laminated on the sealing material, the base sheet is laminated on the adhesive layer, the fluorine resin layer is directly coated on the base sheet, and the arithmetic average roughness (Ra) of the fluorine resin layer as measured in compliance with JIS B0601-1994 is 1.0 μm or more the pigment is at least one pigment selected from the group consisting of a rutile form titanium dioxide and hydrophobic silica, the density of the pigment in the fluorine resin layer in the direction of thickness of the fluorine resin layer is higher on the side opposite from the base sheet than on the side facing the base sheet, and the back protective sheet is configured to reflect light incident from the base sheet at the pigments of the fluorine resin layer toward the solar cell.

2. The solar cell module according to claim 1, wherein the fluorine-containing resin is at least one polymer selected from a polymer composed mainly of chlorotrifluoroethylene and a polymer composed mainly of tetrafluoroethylene.

3. The solar cell module according to claim 1, wherein the content of the pigment in the fluorine resin layer is 20 parts by weight to 90 parts by weight, based on 100 parts by weight of the fluorine resin in terms of the solid faction thereof.

4. The solar cell module according to claim 1, wherein the adhesive layer is composed of a one type of resin selected from the group consisting of ethylene-vinyl acetate copolymer, ethylene-methacrylic acid copolymer, ionomer resin and a mixture thereof.

* * * * *